US005994922A

United States Patent [19]

Aoki et al.

[11] Patent Number: 5,994,922

[45] Date of Patent: Nov. 30, 1999

[54] OUTPUT BUFFER, SEMICONDUCTOR INTEGRATED CIRCUIT HAVING OUTPUT BUFFER AND DRIVING ABILITY ADJUSTING METHOD FOR OUTPUT BUFFER

[75] Inventors: Takahiro Aoki; Takashi Mitsuhashi, both of Tokyo, Japan

[73] Assignee: Kabushiki Kaisha Toshiba, Kawasaki, Japan

[21] Appl. No.: 08/797,289

[22] Filed: Feb. 7, 1997

[30] Foreign Application Priority Data

Feb. 8, 1996 [JP] Japan .................................... 8-022807

[51] Int. Cl.[6] ................................................ H03K 19/0185

[52] U.S. Cl. ................................ 326/87; 326/83; 326/30; 326/16

[58] Field of Search ................................ 326/87, 83, 86, 326/30, 121, 17, 16

[56] References Cited

U.S. PATENT DOCUMENTS 5,162,672 11/1992 McMahan et al. ....................... 326/86
5,254,883 10/1993 Horowitz et al. ......................... 326/86
5,394,034 2/1995 Becker et al. ........................... 326/83
5,621,335 4/1997 Andresen ................................. 326/87
5,717,343 2/1998 Kwong ..................................... 326/27

*Primary Examiner*—Jon Santamauro
*Assistant Examiner*—Don Phu Le
*Attorney, Agent, or Firm*—Foley & Lardner

[57] ABSTRACT

A semiconductor integrated circuit has an internal circuit to execute a predetermined circuit operation, an input node to which output from the internal circuit is provided, and an output buffer capable of changing its driving ability placed between the input node and a signal outputs pad of the semiconductor integrated circuit. The outfit buffer has transistors connected in parallel for driving an external circuit connected to the signal output pad according to the output from the internal circuit and switching circuits. Each switching circuit switches a signal to be provided to each transistor. The switching state of each switching circuit is set according to the load capacity of the external circuit.

7 Claims, 9 Drawing Sheets

200
2
VDD
11a
11
21
2a
11b
D1
VSS
MO
42
VDD
10a
N1
22
VDD
12a
12
S2
3
TS
INTERNAL CIRCUIT
51
10
10b
2b
12b
N2
MO
D2
VSS
MO
41
VSS
43
1
23
VDD
13a
13
2c
13b
D3
VSS
D3 D2 D1
EN
Q
D
50
Q1 BINARY
Q2 COUNTER
Q3
CK
S3
CK
44
45
φ2
φ1

| D1 | D2 | D3 | INVERTER 11 | INVERTER 12 | INVERTER 13 | SUM OF CHANNEL LENGTHS |
|---|---|---|---|---|---|---|
| 1 | 1 | 1 | ON | ON | ON | 7 |
| 0 | 1 | 1 | OFF | ON | ON | 6 |
| 1 | 0 | 1 | ON | OFF | ON | 5 |
| 0 | 0 | 1 | OFF | OFF | ON | 4 |
| 1 | 1 | 0 | ON | ON | OFF | 3 |
| 0 | 1 | 0 | OFF | ON | OFF | 2 |
| 1 | 0 | 0 | ON | OFF | OFF | 1 |

OUTPUT BUFFER, SEMICONDUCTOR INTEGRATED CIRCUIT HAVING OUTPUT BUFFER AND DRIVING ABILITY ADJUSTING METHOD FOR OUTPUT BUFFER

BACKGROUND OF THE INVENTION

1. Field of the Invention

The present invention relates to an output buffer to drive external circuits connected to the output buffer through output pads of a semiconductor integrated circuit, to a semiconductor integrated circuit incorporating the output buffer and to a driving ability adjustment method for control the driving ability of the output buffer.

2. Description of the Related Art

In the prior technology relating to output buffers, there is a conventional output buffer as shown in FIG. 1, for example.

FIG. 1 is a diagram showing a configuration of a semiconductor integrated circuit having a conventional output buffer. A signal S11 output from an internal circuit 101 in the semiconductor integrated circuit 100 is provided to an external circuit (not shown) placed out of a package enclosing this semiconductor integrated circuit 100 through an output buffer 102 and an output pad 103.

The conventional output buffer 102 comprises an inverter 110 for inverting the voltage level of the signal S11 transferred from the internal circuit 101. In the conventional output buffer 102, a plurality of inverters such as the inverters 111, 112 and 113 are incorporated between a node N11 as the output side of the inverter 110 and a node N12 connected to the signal output pad 103 through which the output signal S12 is transferred to the external circuit (not shown).

Next, the operation of driving an external circuit (not shown) connected to the conventional output buffer 102 having the above configuration through the signal output pad 103 will be explained.

FIGS. 2A and 2B are diagrams showing signal wave differences between conventional output buffer whose driving abilities are different to each other. FIG. 2A shows a signal wave when the output buffer drives an external circuit including a load capacity Ca. FIG. 2B shows a signal wave when the output buffer having the same driving ability drives an external circuit including a load capacity Cb. In those cases, there is the relationship that Ca<Cb. In both FIGS. 2A and 2B, the reference character Vth designates a threshold voltage level of an input buffer of an external circuit.

As clearly shown in both FIGS. 2A and 2B, the rising time of the signal is different between the two cases because the load capacity is different to each other between those two cases. Accordingly, in order to obtain the most suitable rising time "t", an output buffer having the most required driving ability must be used for the external circuit.

However, in general, it is difficult to know that an output buffer in a semiconductor integrated circuit will be connected to an external circuit having a load capacity when the semiconductor integrated circuit having the output buffer is manufactured. In order to eliminate this problem, during its fabrication process in the prior art, it is assumed that an external circuit having an load capacity will be connected to a semiconductor integrated circuit having an output buffer which can drive this external circuit adequately.

However, there is a following drawback in the conventional output buffer incorporated in the semiconductor integrated circuit.

That is, in the conventional semiconductor integrated circuit, because the driving ability of the conventional output buffer is determined by assuming that a load capacity of an external circuit, connected to the signal output pad 103 in the semiconductor integrated circuit 100, to be driven by the output buffer is a suitable value, there is a case that an external circuit having a load capacity which is smaller than that of the assumed load capacity will be connected to the output buffer. Because the power consumption of the output buffer 102 is increased according to the magnitude of this driving ability, it causes the waste of the power consumption of the semiconductor integrated circuit when the driving ability of the output buffer is unmatched to the load capacity of the external circuit driven by the output buffer.

SUMMARY OF THE INVENTION

Accordingly, an object of the present invention is, with due consideration to the drawbacks of the conventional output buffer and the semiconductor integrated circuit incorporating the conventional output buffer, to provide an output buffer capable of adjusting its driving ability to the most suitable value according to the magnitude of a load capacity of an external device connected to the output buffer, to provide a semiconductor integrated circuit capable of adjusting the driving ability of an output buffer to the most suitable value according to the magnitude of a load capacity of an external device connected to the semiconductor integrated circuit when the semiconductor integrated circuit is mounted on a printed substrate, and to provide a driving ability adjustment method of adjusting the driving ability of an output buffer to the most suitable value according to the magnitude of a load capacity of an external device connected to a package in which the semiconductor integrated circuit having the output buffer is sealed when the semiconductor integrated circuit is mounted on the printed circuit.

In accordance with one aspect of the present invention, an output buffer comprises: an input node to which an input signal being provided; a signal output pad through which a signal is provided to an external circuit; a plurality of transistors connected in parallel, between the input node and the signal output pad; and a plurality of switching means, each for switching a signal input provided to each of the plurality of transistors, wherein a switching state of each of the plurality of switching means is set according to a magnitude of a load capacity of the external circuit connected to the signal output pad in order to adjust the driving ability of the output buffer.

In accordance with another aspect of the present invention, a semiconductor integrated circuit comprises: an internal circuit for performing a predetermined circuit operation; an input node for receiving an output from the internal circuit; a signal output pad for providing a signal to an external circuit; and an output buffer comprising a plurality of transistors connected in parallel between the input node and the signal output pad, placed between the internal circuit and the signal output pad, for driving the external circuit connected to the signal output pad according to the output from the internal circuit, wherein the output buffer further comprises a plurality of switching means, each of which switches a signal to be transferred to each of the plurality of transistors, and a driving ability of the output buffer is adjusted by setting switching states of the plurality of switching means according to a magnitude of a load capacity of the external circuit.

In accordance with another aspect of the present invention, a semiconductor integrated circuit comprises: an internal circuit for performing a predetermined circuit operation; an input node for receiving an output from the internal circuit; a signal output pad for providing a signal to an external circuit; an output buffer, placed between the internal circuit and the signal output pad, comprising: a plurality of transistors connected in parallel between the input node and the signal output pad, for driving the external circuit connected to the signal output pad according to the output from the internal circuit; and a plurality of switching means, each switching means switching a signal to be transferred to each of the plurality of transistors, a ON/OFF state of each switching means being controlled by receiving each of a plurality of driving ability adjustment signals; a test signal input circuit for providing a test signal to the plurality of switching means in the output buffer instead of the output transferred from the internal circuit during a driving ability adjustment mode; and driving ability automatic adjustment means for receiving the signal transferred from the signal output pad connected to the external circuit and for setting the plurality of driving ability adjustment signals so that the signal transferred from the signal output pad to the external circuit has a predetermined rising time period during the driving ability adjustment mode.

In the semiconductor integrated circuit described above, the driving ability automatic adjustment means comprises: a binary counter for receiving a count-up signal, for executing a count-up operation, for outputting the plurality of driving ability adjustment signals and for halting execution of the count-up operation when receiving an enable signal; and a flip-flop for receiving the signal from the signal output pad connected to the external circuit, whose receiving time being delayed from the receiving time of the test signal by a predetermined time period and for outputting the enable signal to the binary counter during the driving ability adjustment mode.

In accordance with another aspect of the present invention, a semiconductor integrated circuit comprises: an internal circuit for performing a predetermined circuit operation; an input node for receiving an output from the internal circuit; a signal output pad for providing a signal to an external circuit; an output buffer, placed between the internal circuit and the signal output pad, comprising: a plurality of transistors connected in parallel between the input node and the signal output pad, for driving the external circuit connected to the signal output pad according to the output from the internal circuit; and a plurality of switching means, each switching means switching a signal to be transferred to each of the plurality of transistors, a ON/OFF state of each switching means being controlled by receiving each of a plurality of driving ability adjustment signals; data store means for storing data used for generating the plurality of driving ability adjustment signals for setting the switching state of each of the plurality of switching means according to the magnitude of the load capacity of the external circuit.

In the semiconductor integrated circuit described above, the data store means comprises a programmable logic array.

In the semiconductor integrated circuit described above, the data store means comprises an EP-ROM and a controller for reading information stored in the EP-ROM and for generating the plurality of the driving ability adjustment signals.

In the semiconductor integrated circuit described above, each of the plurality of switching means comprises a MOS transistor.

In the semiconductor integrated circuit described above, a ratio of channel lengths of the plurality of transistors is 1: 2: . . . :2n, where n=0, 1, 2, . . . , m and m is the number of the plurality of transistors.

In accordance with another aspect of the present invention, a driving ability adjustment method for an output buffer incorporated in a semiconductor integrated circuit comprising: an input node for receiving an output from an internal circuit; a signal output pad; and an output buffer comprising a plurality of transistors connected in parallel between the input node and the signal output pad, placed between the internal circuit and the signal output pad, for driving an external circuit connected to the signal output pad according to the output from the internal circuit, and a plurality of switching means, each of which switches a signal to be transferred to each of the plurality of transistors, and a driving ability of the output buffer is adjusted by setting switching states of the plurality of switching states according to a magnitude of a load capacity of the external circuit, the driving ability adjustment method comprises the steps of: during a driving ability adjustment mode, providing a test signal to the output buffer instead of the output transferred from the internal circuit; receiving a signal transferred from the signal output pad; setting the plurality of driving ability adjustment signals so that the signal from the output buffer has a predetermined rising time period; and changing a state of the semiconductor integrated circuit from the driving ability adjustment mode to a normal operation mode in which the output from the internal circuit is transferred to the external circuit through the output buffer.

According to the present invention, the number of the transistors connected in parallel in the output buffer is adjusted suitably according to the load capacity of the external circuit, so that the driving ability of the output buffer connected to the external circuit is also adjusted to the most suitable value according to the load capacity of the external circuit. In addition, according to the present invention, the number of the transistors connected in parallel in the output buffer can be adjusted automatically according to the load capacity of the external circuit so that the driving ability of the output buffer connected to the external circuit is adjusted to the most suitable value according to the load capacity of the external circuit.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a according to the present invention will now be described with reference to the drawings.

First Embodiment

Figure 1:
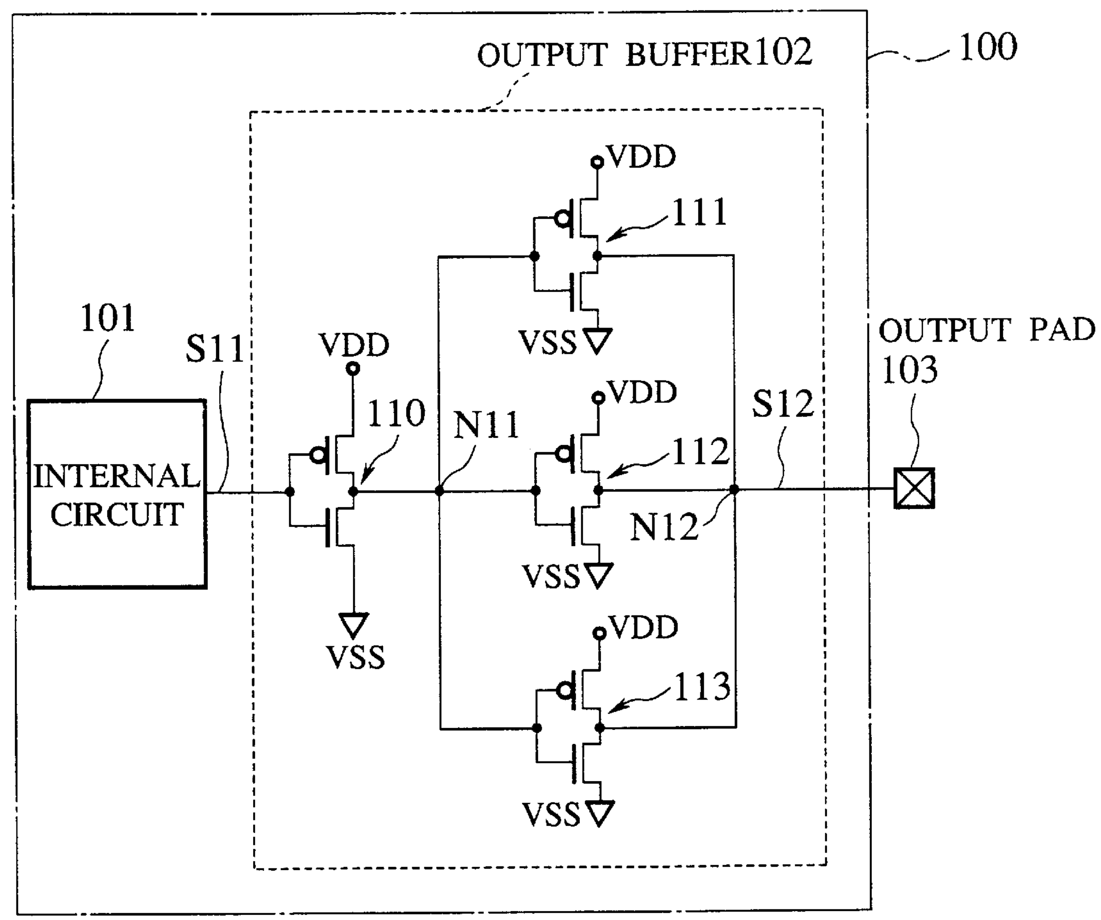
FIG. 1 is a circuit diagram showing the configuration of a conventional semiconductor integrated circuit.
Figure 2A:
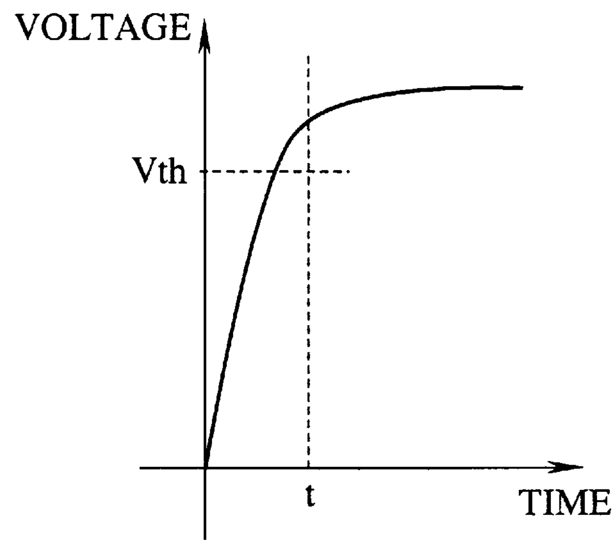
FIGS. 2A and 2B are graphs showing the difference between signal wave-forms of different driving abilities of conventional output buffers.
Figure 2B:
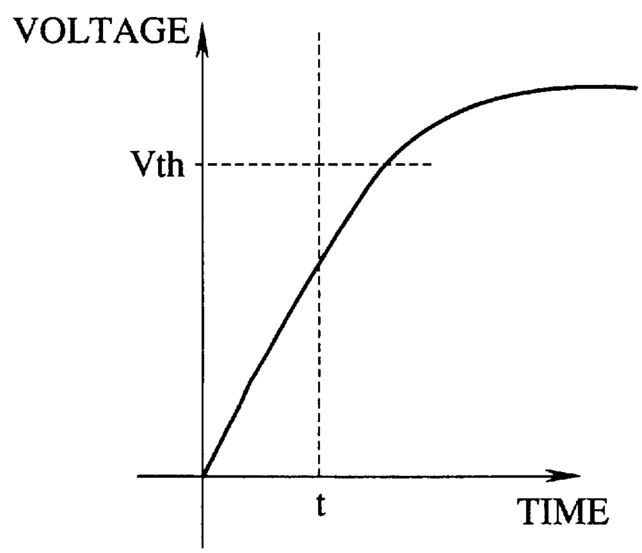
Figure 3:
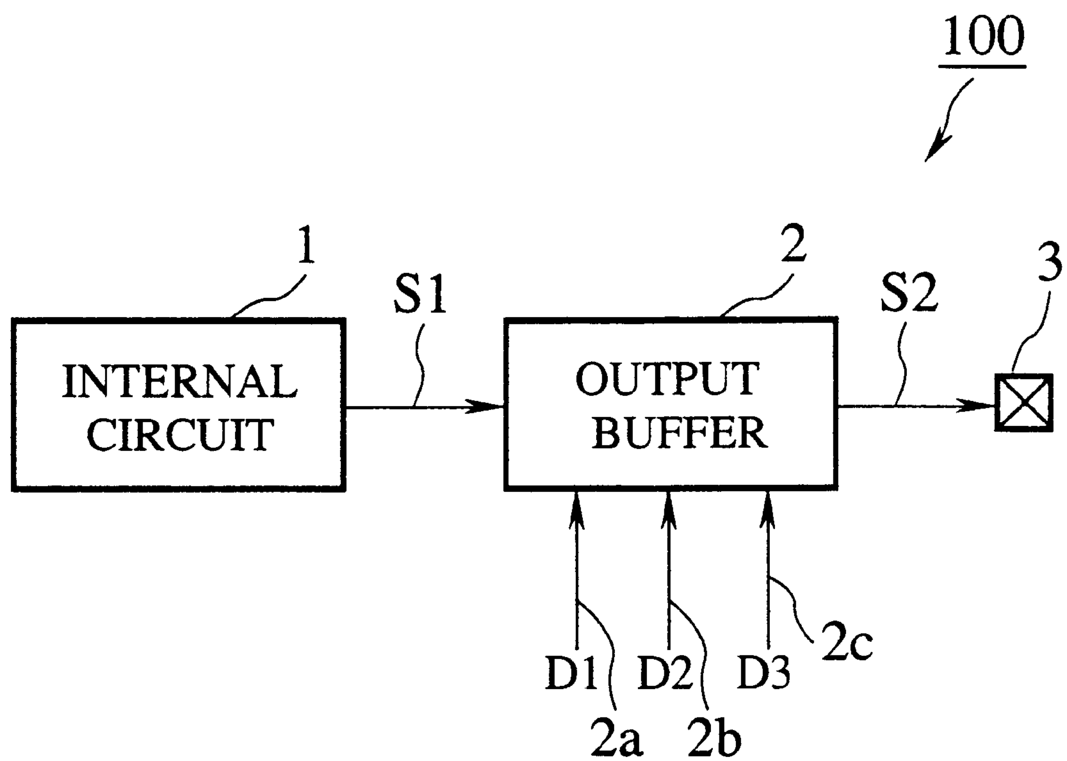
FIG. 3 is a block diagram showing a configuration of a semiconductor integrated circuit according to a first embodiment of the present invention.

FIG. 3 is a block diagram showing a configuration of a semiconductor integrated circuit 100 according to a first embodiment of the present invention.

In the semiconductor integrated circuit 100 of the first embodiment shown in FIG.3, an internal circuit performing a predetermined circuit operation is incorporated and an output side of the internal circuit 1 is connected to a signal output pad 3 located at the peripheral section of the semiconductor integrated circuit 100 through the output buffer 2. The output buffer 2 receives the signal S1 from the internal circuit 11 through an input terminal (not shown) of the output buffer 2 and then outputs the output signal S2 to drive an external circuit (not shown) through the signal output pad 3 to the external circuit (the detailed configuration of the output buffer 2 will be explained later).

The output buffer 2 has terminals 2*a*, 2*b* and 2*c* used for receiving control signals of a driving ability adjustment. The driving ability of the output buffer 2 is changed by receiving voltages D1, D2 and D3 provided through the terminals 2*a*, 2*b* and 2*c*.

Figure 4:
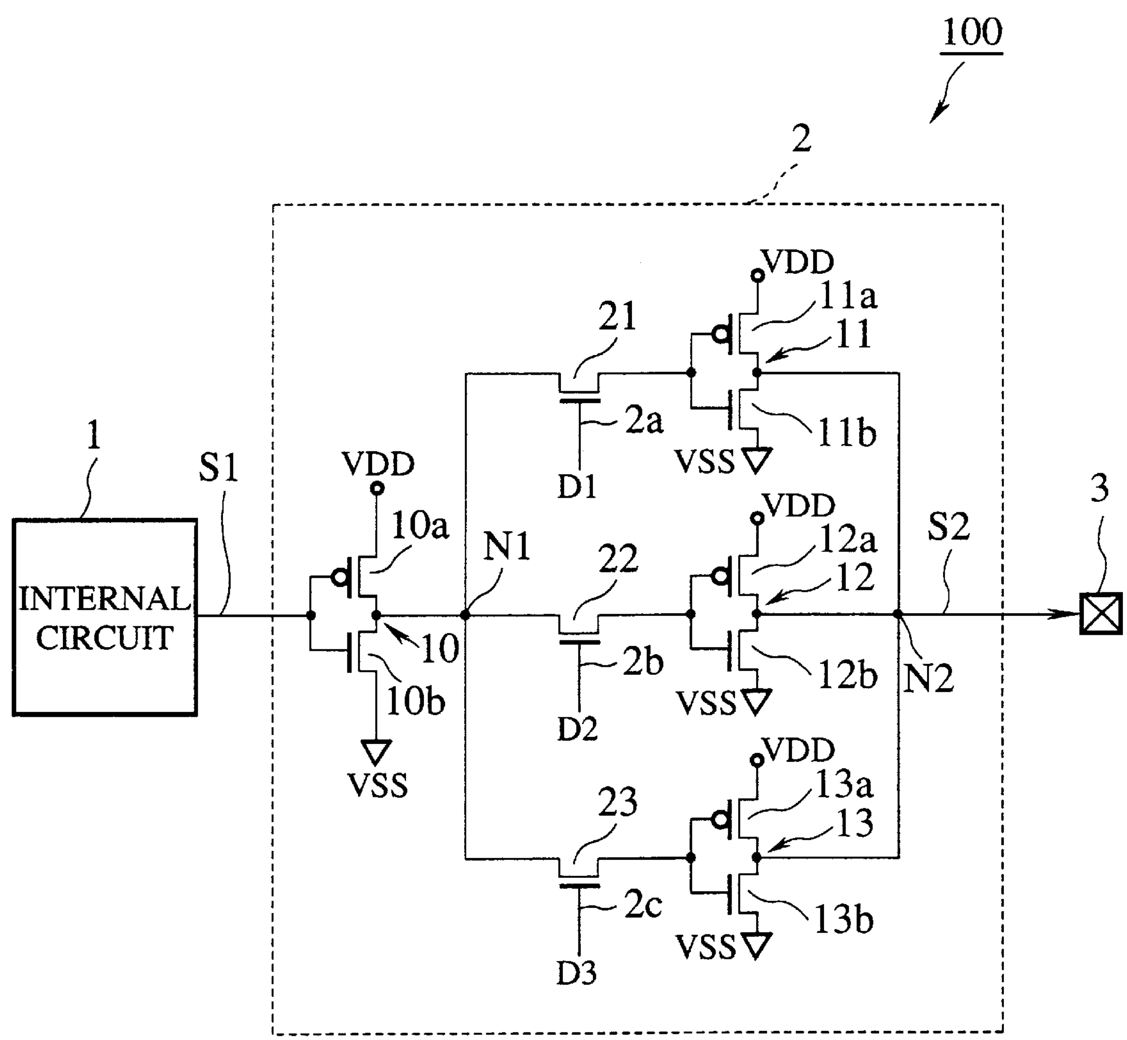
FIG. 4 is a circuit diagram mainly showing a configuration of an output buffer incorporated in the semiconductor integrated circuit according to the first embodiment shown in FIG. 3.

FIG. 4 is a circuit diagram mainly showing the configuration of the output buffer 2 incorporated in the semiconductor integrated circuit 100 according to the first embodiment shown in FIG. 3.

The output buffer 2 comprises an inverter 10 to invert and amplify the signal S1 transferred from the internal circuit 1 and three inverters 11, 12 and 13 placed between the node N1 at the output side of the inverter 10 and the node N2 connected to the output pad 3. In addition, the output buffer 2 comprises pass transistors 21, 22 and 23 placed between the input side of the inverters 11, 12, and 13 and the node N1. The three pass transistors 21, 22 and 23 are placed in parallel to each other. The number of the pass transistors in the output buffer 2 according to the present invention is changed according to a required driving ability and the number of the inverters connected to each other in parallel can be changed.

The pass transistors 21, 22 and 23 are driven by receiving the levels of the driving ability adjustment signals D1, D2 and D3 provided to the terminals 2*a*, 2*b* and 2*c*, respectively. By receiving these driving ability adjustment signals 2*a*, 2*b* and 2*c*, the input side of each of the inverters 11, 12 and 13 is connected to the node N1, respectively. The number of the inverters connected to the node N1 and connected to each other in parallel can be changed.

The inverter 10 comprises a P-channel CMOS transistor 10*a* (hereinafter referred to as P-MOS transistor) and a N-channel CMOS transistor 10*b* (hereinafter referred to as N-MOS transistor). Similarly to the inverter 10, the inverters 11, 12 and 13 comprise a P-MOS transistor 11*a* and a N-MOS transistor 11*b*, a P-MOS transistor 12*a* and a N-MOS transistor 12*b*, and a P-MOS transistor 13*a* and a N-MOS transistor 13*b*, respectively.

The signal S1 from the internal circuit 1 is provided to each gate of the P-MOS transistor 10*a* and the N-MOS transistor 10*b* in the inverter 10. Each drain of the P-MOS transistor 10*a* and the N-MOS transistor in the inverter 10 is connected to the node N1. Each gate of the P-MOS transistor 11*a* and the N-MOS transistor 11*b* in the inverter 11 is connected to the node N1 through the pass transistor 21. Like this, the Each gate of the P-MOS transistor 12*a* and the N-MOS transistor 12*b* in the inverter 12 is connected to the node N1 through the pass transistor 22, and each gate of the P-MOS transistor 13*a* and the N-MOS transistor 13*b* in the inverter 13 is connected to the node N1 through the pass transistor 23. In addition, each gate of the MOS transistors forming each inverters 11, 12 and 13 is connected to the node N2.

The feature of the operation of the semiconductor integrated circuit 100 of the first embodiment having the configuration described above will be explained.

Figures 5, 6:
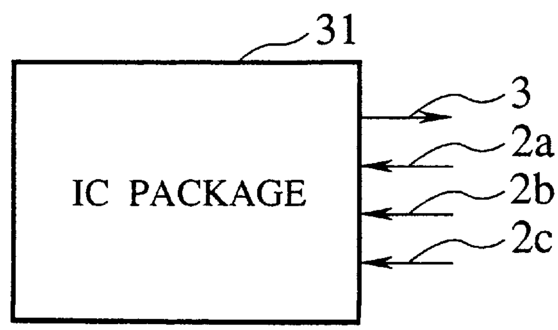
FIG. 5 is an explanation diagram for explaining a driving ability adjustment operation of the output buffer according to the first embodiment shown in FIG. 4.
FIG. 6 is a diagram showing an IC package of a semiconductor integrated circuit incorporating the output buffer having the adjusting the driving ability adjustment function shown in FIGS. 3 to 5.

In order to adjust the driving ability of the output buffer 2 to the load capacity of the external circuit (not shown) connected to the output buffer 2 through the output pad 3. The number of the inverters 11, 12 and 13 connected to each other in parallel in the output buffer 2 can be changed according to the voltage level of the driving ability adjustment signal D1, D2 and D3. This driving ability adjustment function of the output buffer 2 will be explained in detail with reference to FIG. 5. FIG. 5 is the explanation diagram for explaining the driving ability adjustment operation of the output buffer 2 in the semiconductor integrated circuit 100 according to the first embodiment shown in FIG. 4.

In the following explanation, we define that when the voltage level of the driving ability adjustment signal D1 is “1”, it drives the pass transistor 21. That is, when the voltage level of the driving ability adjustment signal D1 is “1”, the pass transistor 21 is driven, namely enters an active state and then the signal S1 is transferred to the inverter 11 through this pass transistor 21. In addition, when the voltage level of the driving ability adjustment signal D1 is “0”, the pass transistor 21 is not driven, namely enters an inactive state, and the signal S1 is not transferred through the pass transistor 21. Like this case, when the voltage level of each of the driving ability adjustment signals D2 and D3 is “1”, the signal S1 is transferred to the inverters 12 and 13 and when the voltage level of each of the driving ability adjustment signals D2 and D3 is “0”, no signal S1 is transferred to the inverters 12 and 13.

As shown in FIG. 5, when the voltage levels “1”, “1”, and “1” are provided to the terminals 2*a*, 2*b* and 2*c*, respectively, the all of the inverter 11, 12 and 13 are substantially connected to each other because the pass transistors 21, 22 and 23 enter the active state, namely are driven by the driving ability adjustment signals D1, D2 and D3 whose voltage levels are "1". In this case, when the voltage level of the node N1 is "1" (the level of the signal S1 is "0"), only the N-MOS transistors 11*b*, 12*b* and 13*b* in the inverters 11, 12 and 13 become the ON-state, namely enter the active state. On the contrary, when the voltage level of the node N1 is "0" (the level of the signal S1 is "1"), only the P-MOS transistors 11*a*, 12*a* and 13*a* in the inverters 11, 12 and 13 become the ON-state, namely enter the active state.

In like manner, when the voltage levels "0", "1" and "1" are provided to the terminals 2*a*, 2*b* and 2*c* of the pass transistors 21, 22 and 23, the inverters 12 and 13 are connected in parallel. When the voltage levels "1", "0" and "1" are provided to the terminals 2*a*, 2*b* and 2*c* of the pass transistors 21, 22 and 23, the inverters 11 and 13 are connected in parallel. When the voltage levels "0", "0" and "1" are provided to the terminals 2*a*, 2*b* and 2*c* of the pass transistors 21, 22 and 23, only the inverter 13 is connected to the node N1.

In addition, when the voltage levels "1", "1" and "0" are provided to the terminals 2*a*, 2*b* and 2*c* of the pass transistors 21, 22 and 23, the inverters 11 and 12 are connected in parallel. When the voltage levels "0", "1" and "0" are provided to the terminals 2*a*, 2*b* and 2*c* of the pass transistors 21, 22 and 23, only the inverter 12 is connected to the node N1. When the voltage levels "1", "0" and "0" are provided to the terminals 2*a*, 2*b* and 2*c* of the pass transistors 21, 22 and 23, only the inverter 11 is connected to the node N1.

When the ratio of the channel lengths of the inverters 11, 12 and 13 in the output buffer 2 shown in FIG. 4 is 1:2:4, it is possible to form the output buffer whose channel length is 1, 2, 3, 4, 5, 6, 7 according to the combination of the driving ability adjustment signals D1, D2 and D3 to be provided to the terminals 2*a*, 2*b* and 2*c* of the pass transistors 21, 22 and 23. That is, changing of the channel length of the output buffer 2 means to change the driving ability of the output buffer 2.

For example, the total channel length of the output buffer 2 has seven "7" that is the maximum value when the voltage levels of the driving ability adjustment signals D1, D2 and D3 are "1", "1" and "1". The total channel length of the output buffer 2 becomes 6 when the voltage level of the driving ability adjustment signals D1, D2 and D3 are "0", "1" and "1". The total channel length of the output buffer 2 becomes 5 when the voltage level of the driving ability adjustment signals D1, D2 and D3 are "1", "0" and "1". The total channel length of the output buffer 2 becomes 4 when the voltage level of the driving ability adjustment signals D1, D2 and D3 are "0", "0" and "1". The total channel length of the output buffer 2 becomes 3 when the voltage level of the driving ability adjustment signals D1, D2 and D3 are "1", "1" and "0". The total channel length of the output buffer 2 becomes 2 when the voltage level of the driving ability adjustment signals D1, D2 and D3 are "0", "1" and "0". The total channel length of the output buffer 2 becomes 1 that is the minimum value when the voltage level of the driving ability adjustment signals D1, D2 and D3 are "1", "0" and "0".

In the explanation of the output buffer 2 in the semiconductor integrated circuit 100 according to the first embodiment, the number of the inverters, connected in parallel to each other, in the output buffer 2 is 3, but the present invention is not limited by this case, for example the number of the inverters in the output buffer can be increased or decreased according to required driving ability of the output buffer. In general, it is possible to form the output buffer having the (2m −1) kinds of the driving ability (m is the number of the transistors forming the inverters in the output buffer) by incorporating the m-transistors in the inverters in the output buffer. The ratio of the channel lengths of the m-transistors is 1:2:3: . . . :2n (where n=0, 1, 2, . . . , "m" and "m" is the number of the transistors).

As described above, connecting a plurality of transistors (for example, the inverters 11 to 13 in the first embodiment) in parallel is equal to increase the channel length of a transistor. Therefore it is possible to increase the driving ability of the output buffer 2 according to the increase of the numbers of the transistors connected in parallel. In addition, because the increase of the power consumption of the output buffer 2 is proportional to the increase of the channel length of the transistor, the output buffer of the present invention makes it possible to eliminate the waste of the power consumption of the semiconductor integrated circuit by adjusting the channel length of the transistors in the output buffer. That is, the most suitable channel length can be provided according to external devices to be connected to the semiconductor integrated circuit.

FIG. 6 is a diagram showing an IC package 31 of the semiconductor integrated circuit 100 incorporating the output buffer 2 having the adjusting the driving ability adjustment function shown in FIGS. 3 to 5.

As shown in FIG.6, the semiconductor integrated circuit 100 comprising the internal circuit 1 and the output buffer 2 is placed and sealed in the package 31. The terminals 2*a*, 2*b* and 2*c* for the driving ability adjustment of the output buffer 2 and the signal output pad 3 are formed at the side of the IC package 31.

When the semiconductor integrated circuit is mounted on a printed substrate (not shown), the driving ability of the output buffer 2 can be adjusted to the most suitable value by supplying the driving ability adjustment signal D1, D2 and D3 to the terminals 2*a*, 2*b* and 2*c* according to the load capacity of an external circuit connected to the semiconductor integrated circuit through the signal output pad 3.

Second Embodiment

Figure 7:
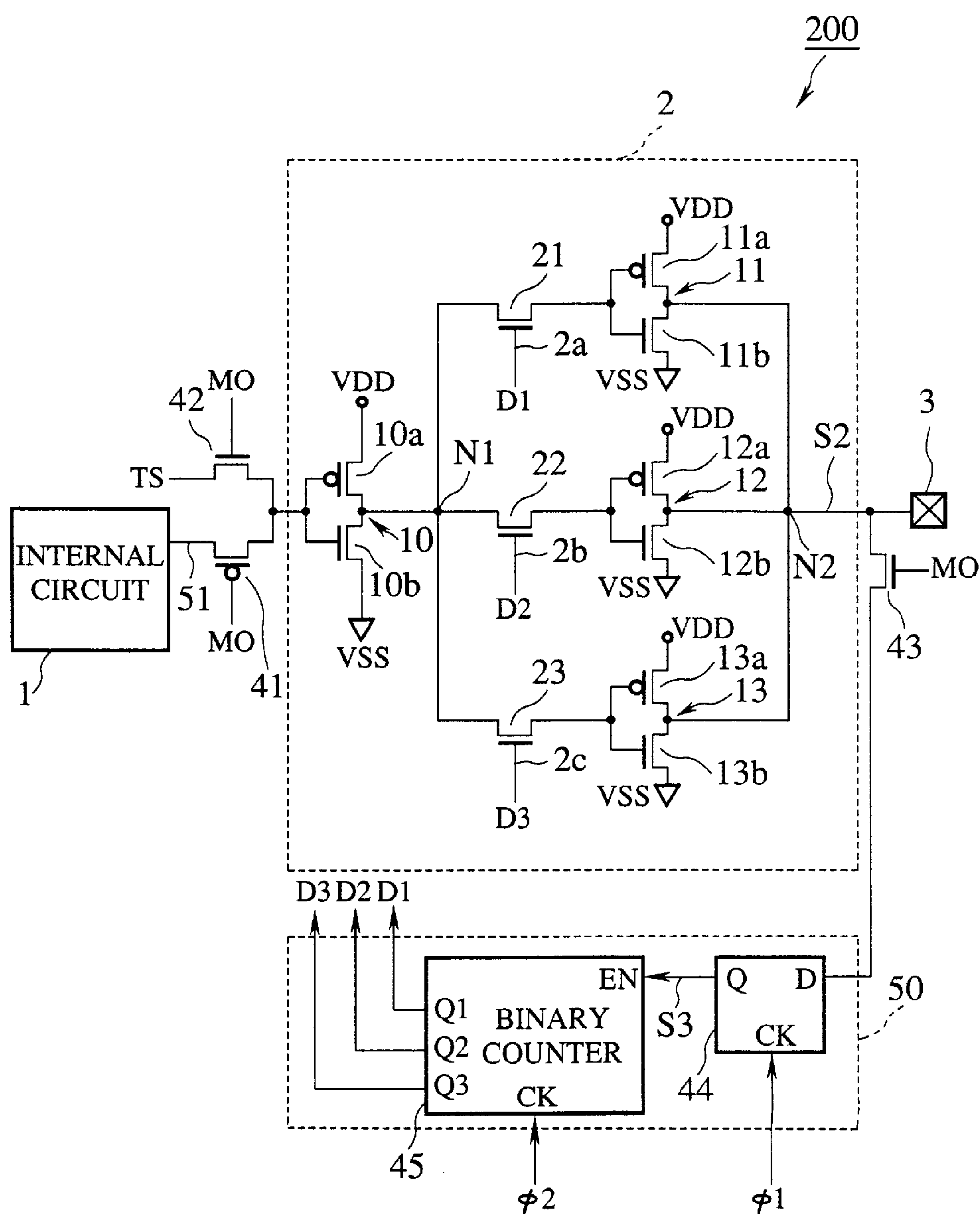
FIG. 7 is a circuit diagram showing the configuration of the semiconductor integrated circuit according to the second embodiment of the present invention.

FIG. 7 is a circuit diagram showing the configuration of the semiconductor integrated circuit according to the second embodiment of the present invention. The same reference numbers are used for the same components between the semiconductor integrated circuit 100 of the first embodiment shown in FIG. 4 and the semiconductor integrated circuit 200 of the second embodiment for brevity. Therefore the explanation of those same components are omitted here.

The semiconductor integrated circuit 200 of the second embodiment shown in FIG. 7 is capable of adjusting automatically the driving ability of the output buffer 2 in addition to the function of the semiconductor integrated circuit 100 of the first embodiment shown in FIG. 4.

In the configuration of the semiconductor integrated circuit 200 of the second embodiment shown in FIG. 7, a pass transistor 41 that is formed by a N-MOS transistor is connected between the output side of the internal circuit 1 and the input side of the output buffer 2. In addition, a pass transistor 42 that is formed by a N-MOS transistor is connected to the input side of the inverter 10.

These pass transistors 41 and 42 are driven or enters the ON/OFF states by receiving a driving ability adjustment mode signal MO. Through the pass transistor 41, the signal S1 is transferred from the internal circuit 1. Thus, the pass transistor 41 switches the transmission of the signal S1. The pass transistor 42 switches the transmission of the test signal TS.

In addition, the node N2 of the output buffer 2 is connected to a pass transistor 43 that is formed by a N-MOS transistor in addition to the signal output pad 3. Through the pass transistor 43, the node N2 is connected to a data input terminal D of a flip-flop 44 as an edge trigger. A control signal S3 is transferred from the data output terminal Q of the flip-flop 44 to an enable terminal EN of a binary counter 45 of 3 bits. The driving ability adjustment signals D1, D2 and D3 (the function of these driving ability adjustment signals D1, D2 and D3 have been described in the explanation for the semiconductor integrated circuit 100 as the first embodiment) are generated by the binary counter 45 and transferred from output terminals Q1, Q2 and Q3 of the binary counter 45 to the terminals 2*a*, 2*b* and 2*c* of the output buffer 2. Hereinafter, the circuit of both the flip-flop 44 and the binary counter 45 is referenced to as "a driving ability automatic adjustment circuit 50".

The pass transistor 43 is driven and enters the ON/OFF states by receiving the driving ability adjustment mode signal MO. The flip-flop 44 receives the signal S2 transferred through the pass transistor 43 and transfers the control signal S3 to the binary counter 45 in synchronism with a signal ϕ 1. The binary counter 45 performs no its counting-up operation and generates the driving ability adjustment signals D1, D2 and D3 and provides these signals D1, D2 and D3 to the output buffer 2 while the binary counter 45 receives the control signal S3 even if the binary counter 45 receives the pulses of the signal ϕ 2. In the semiconductor integrated circuit 200 of the second embodiment, we assume that the ratio of the channel lengths of the transistors forming the inverters 11, 12 and 13 is 1:2:4.

In the semiconductor integrated circuit 200 of the second embodiment having the configuration described above, the driving ability adjustment mode signal MO of the voltage level "1" is provided to the gates of the pass transistors 41, 42 and 43 in order to enter the semiconductor integrated circuit 200 into the driving ability adjustment mode of the output buffer 2.

Thus, by providing the driving ability adjustment mode signal MO, the output buffer 2 is electrically separated from the internal circuit 2 (in this case, no signal S1 is transferred to the output buffer 2) and the signal S2 is transferred to the driving ability automatic adjustment circuit 50.

When the test signal TS is transferred to the output buffer 2 through the pass transistor 42, the driving ability automatic adjustment circuit 50 adjusts the voltage level of the driving ability adjustment signals D1, D2 and D3 to be provided to the pass transistors 21, 22 and 23 so that the signal S2 generated by the output buffer 2 has the most suitable rising edge "t".

Figure 8:
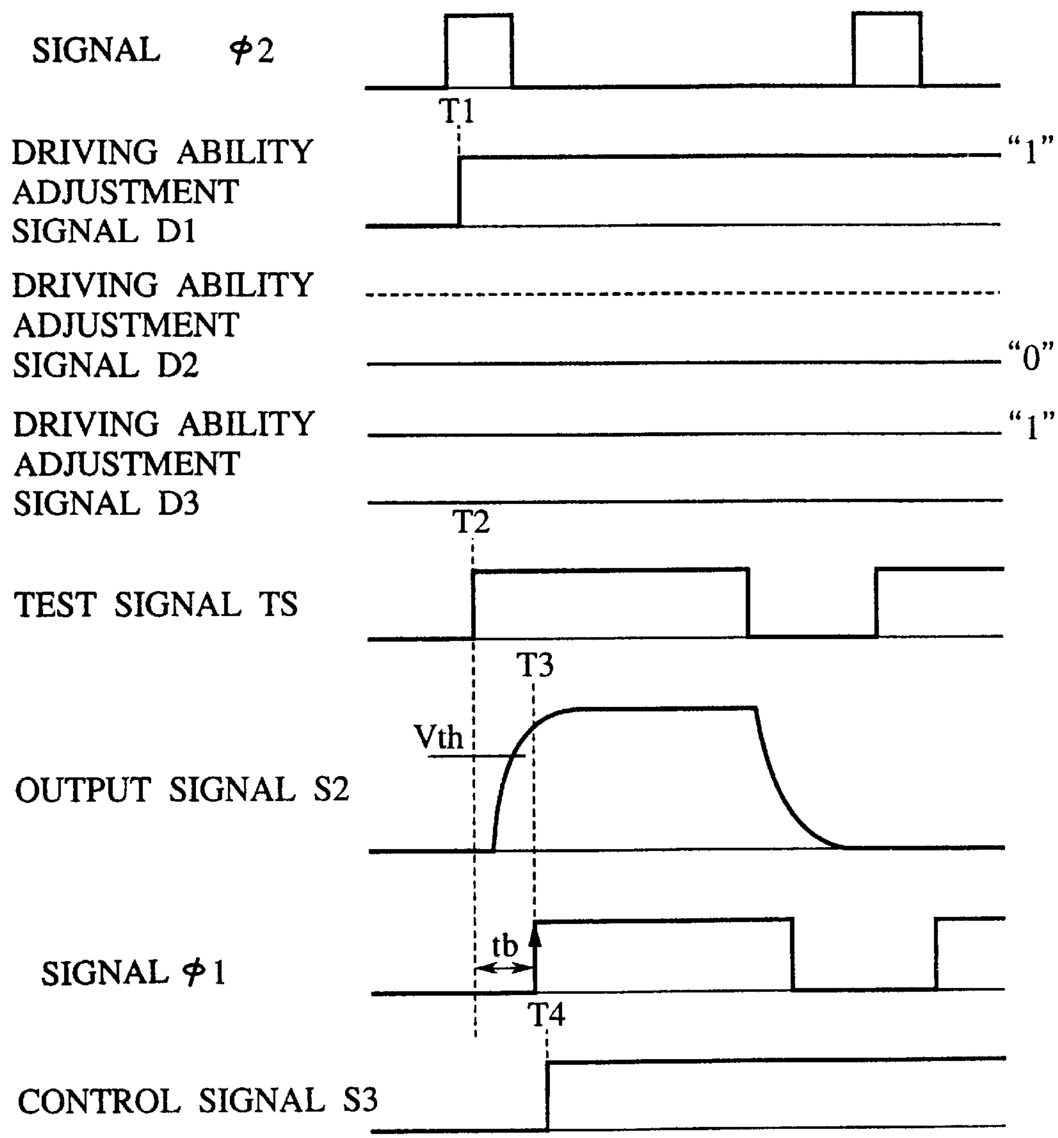
FIG. 8 is a timing chart showing the operation of the semiconductor integrated circuit according to the second embodiment of the present invention.

Next, the operation of the semiconductor integrated circuit 200 of the second embodiment will be explained in detail with reference to FIG. 8. FIG. 8 is a timing chart showing the operation of the semiconductor integrated circuit 200 according to the second embodiment of the present invention.

First, the signal ϕ 2 is provided to the binary counter 45 in order to count up the binary counter 45 itself. In the timing chart shown in FIG. 8, at the time "T1", the driving ability adjustment signals D1, D2 and D3 of the voltage levels "1", "0", "1" are provided from the binary counter 45 to the terminals 2*a*, 2*b* and 2*c*, respectively when the binary counter 45 is counted up. Then, both the pass transistors 21 and 23 enter the active state, namely enter a signal passing state. Thereby, both the inverters 11 and 13 in the output buffer 2 perform in parallel.

Next, the test signal TS is provided to the output buffer 2 through the pass transistor 42 at the time "T2". The charge-up operation of both the inverters 11 and 13 in the output buffer 2 is initiated for the load capacity of the external circuit (not shown) by receiving the test signal TS. Then, the voltage level of the output signal S2 is increased gradually. The signal ϕ 1 is provided to the flip-flop 44 at the time "T3" that is delayed by the time "tb" after receiving the test signal TS. Here, the time "tb" is the time obtained by adding the suitable rising time of the output signal S2 with the time of the setting-up of the flip-flop 44.

If the voltage level of the output signal S2 is reached to the threshold voltage level Vth of the inverters 11 and 13, the flip-flop 44 inputs the output signal S2 at the rising edge of the signal ϕ 1 and then outputs the control signal S3 to the binary counter 45 (at the time "T4"). When inputting the control signal S3, the binary counter 45 performs no counting-up operation even if the signal ϕ 2 is given to the binary counter 45. As the result, the voltage levels of the driving ability adjustment signals D1, D2 and D3 are fixed, for example "1", "0" and "1", respectively.

As described above in detail, in the semiconductor integrated circuit 200 of the second embodiment, the voltage levels of the driving ability adjustment signals D1, D2 and D3 to be provided to the terminals 2*a*, 2*b* and 2*c* used for the driving ability adjustment operation to be executed in the output buffer 2 can be adjusted automatically.

Third Embodiment

Figure 9:
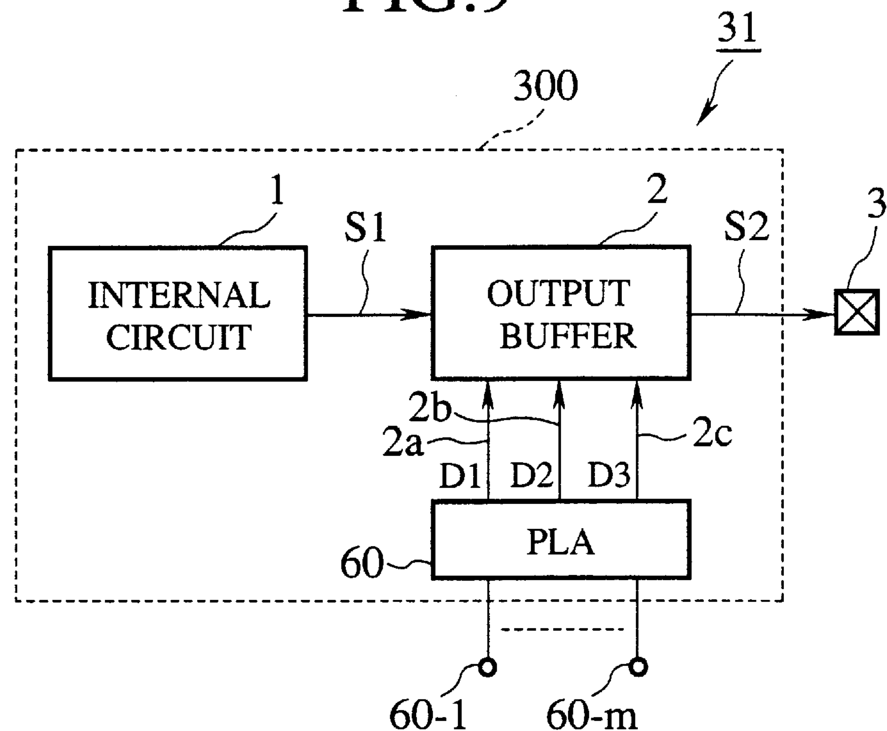
FIG. 9 is a block diagram showing a configuration of the semiconductor integrated circuit according to the third embodiment of the present invention.

FIG. 9 is a block diagram showing a configuration of the semiconductor integrated circuit 300 according to the third embodiment of the present invention. The same reference numbers are used for the same components between the semiconductor integrated circuit 100 of the first embodiment shown in FIG. 4 and the semiconductor integrated circuit 300 of the third embodiment for brevity. Therefore the explanation of those same components are omitted here.

In the semiconductor integrated circuit 300 of the third embodiment placed in a package 31, a programmable logic array (PLA) whose function can be changed externally is incorporated, for example. The terminals 2*a*, 2*b* and 2*c* used for adjusting the driving ability of the output buffer 2 are sealed in the packaged 31.

Figure 10:
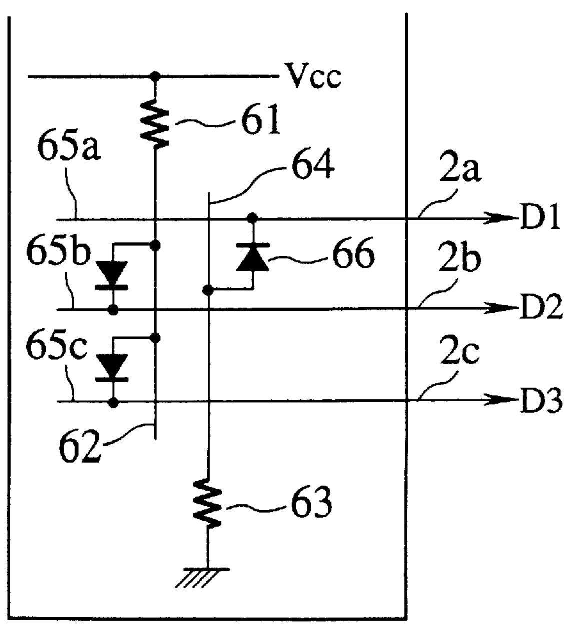
FIG. 10 is a circuit diagram showing a configuration of a PLA incorporated in the semiconductor integrated circuit shown in FIG. 9.

FIG. 10 is a circuit diagram showing a configuration of the PLA 60 incorporated in the semiconductor integrated circuit 300 shown in FIG. 9. In the package 31, the semiconductor integrated circuit 300 of the third embodiment is sealed. The semiconductor integrated circuit 300 comprises the PLA 60 in addition to the internal circuit 1 and the output buffer 2. As shown in FIG. 10, a line 62 connected to a pull-up resistance 61, a line 64 connected to a pull-down resistance 63 and lines 65*a*, 65*b* and 65*c* connected to the terminals 2*a*, 2*b* and 2*c*, respectively, are incorporated in the PLA 60. A diode 66 is formed at each of cross points in the PLA 60. The PLA 60 can be programmed so that the PLA 60 can generate and provide predetermined outputs through the terminals 2*a*, 2*b* and 2*c* by the combination of inputs to input terminals 60-1, . . . , 60-m of the PLA 60. Thus, by selecting the combination of the inputs to the input terminals 60-1, . . . , 60-m in the PLA 60 in order to generate the driving ability adjustment signals D1, D2 and D3 to the output buffer 3, the driving ability of the output buffer 2 can be adjusted to the most suitable value according to the load capacity of an external circuit (not shown) connected to the output pad 3 of the semiconductor integrated circuit 400 when it is mounted on a printed substrate.

In the semiconductor integrated circuit 300 of the third embodiment, the PLA 60 is programmed externally in order to adjust the driving ability of the output buffer 3 according to the load capacity of an external circuit connected to the output buffer 3 when the package 31 enclosing the semiconductor integrated circuit 300 is mounted on a printed substrate. The semiconductor integrated circuit 300 of the third embodiment has the same function of the semiconductor integrated circuit 100 of the first embodiment.

Fourth Embodiment

Figure 11:
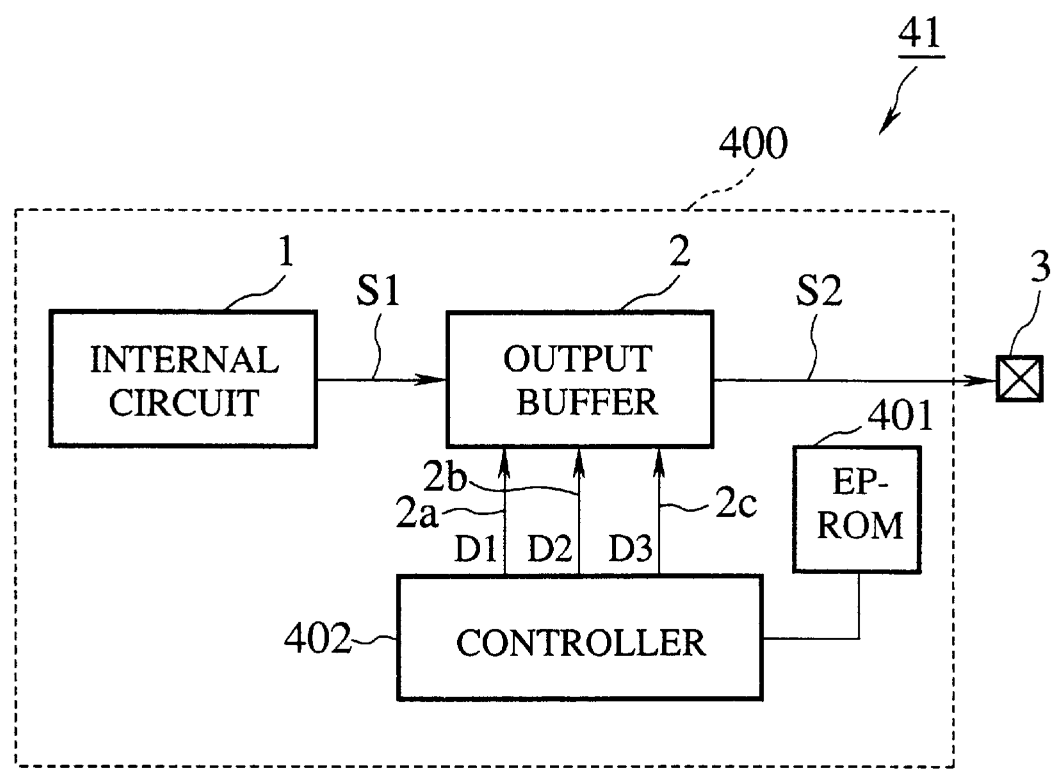
FIG. 11 is a block diagram showing a configuration of the semiconductor integrated circuit according to the fourth embodiment of the present invention.

FIG. 11 is a block diagram showing a configuration of the semiconductor integrated circuit 400 according to the fourth embodiment of the present invention. The same reference numbers are used for the same components between the semiconductor integrated circuit 100 of the first embodiment shown in FIG. 4 and the semiconductor integrated circuit 400 of the fourth embodiment for brevity. Therefore the explanation of those same components are omitted here.

In the semiconductor integrated circuit 400 of the fourth embodiment, information relating to the driving ability adjustment for the output buffer 2 is stored in an EP-ROM 401 in advance, and then a controller 402 reads the information, generates the driving ability adjustment signals D1, D2 and D3, and transfers the generated signals D1, D2 and D3 to the terminals 2*a*, 2*b* and 2*c* when the driving ability of the output buffer 2 is adjusted.

Thus, the feature of the semiconductor integrated circuit 400 of the fourth embodiment is that the function to adjust the driving ability of the output buffer 2 is formed by the EP-ROM 401 and the controller 402.

The semiconductor integrated circuit 400 comprising the internal circuit 1, the output buffer 3, the EP-ROM 401 and the controller 402 is sealed in the package 41.

As shown in FIG. 11, the output terminals of the controller 402 are connected to both the EP-ROM 402 and the terminals 2*a*, 2*b* and 2*c* of the output buffer 3.

In the semiconductor integrated circuit 400 of the fourth embodiment, the controller 402 reads the information stored in the EP-ROM 401 according to the magnitude of the load capacity of the external circuit (not shown) and generates the driving ability adjustment signals D1, D2 and D3 and then outputs the signals D1, D2 and D3 to the output buffer 3 through the terminals 2*a*, 2*b* and 2*c* when the package 41 is mounted on a printed substrate. Thus, the semiconductor integrated circuit 400 of the fourth embodiment having the configuration described above has the same function of the semiconductor integrated circuit 100 of the first embodiment.

In the semiconductor integrated circuits 100, 200, 300 and 400 of the first to fourth embodiments, the number of the transistors in the inverters of the output buffer 3 is three, but the present invention is not limited by this configuration of the output buffer. For example, the present invention can be applicable to semiconductor integrated circuits in which the number of the transistors forming a plurality of the inverters connected in parallel is more than three.

As described above in detail, according to the output buffer of the present invention, a plurality of pass transistors (switching means) to switch control signals to be provided to transistors forming the inverters in the output buffer are incorporated and these switching states of the pass transistors are controlled according to the load capacity of an external circuit to be connected to the output buffer. Thereby, there is the effect that the driving ability of the output buffer can be adjusted to the most suitable value according to the load capacity of the external circuit when a semiconductor integrated circuit comprising the output buffer and the external circuit are mounted on a printed substrate and the power consumption of the output buffer can be reduced.

In addition, according to the semiconductor integrated circuit comprising the output buffer of the present invention, the output buffer comprises a plurality of pass transistors (switching means) to switch control signal to be provided to the transistors forming the inverters of the output buffer and these switching states of the pass transistors are controlled according to the load capacity of an external circuit to be connected to the output buffer. Thereby, there is the effect that the driving ability of the output buffer can be adjusted to the most suitable value according to the load capacity of the external circuit when the semiconductor integrated circuit comprising the output buffer and the external circuit are mounted on a printed substrate and the power consumption of the semiconductor integrated circuit can be reduced.

Furthermore, according to the semiconductor integrated circuit comprising the output buffer of the present invention, the output buffer comprises a plurality of pass transistors (switching means) to switch control signal to be provided to the transistors forming the inverters of the output buffer and the semiconductor integrated circuit comprises a test signal input circuit to provide the test signal to the output buffer instead of the output from the internal circuit and a driving ability automatic adjustment circuit for receiving a signal from an output pad connected to the external circuit and for determining the voltage level of the driving ability adjustment signals so that the rising edge of the signal at the output pad has the predetermined rising time during the driving ability adjustment mode. Thereby, there is the effect that the driving ability of the output buffer can be adjusted automatically to the most suitable value according to the load capacity of the external circuit when the semiconductor integrated circuit comprising the output buffer and the external circuit are mounted on a printed substrate and the power consumption of the semiconductor integrated circuit can be reduced.

Moreover, according to the semiconductor integrated circuit comprising the output buffer of the present invention, the driving ability adjustment circuit comprises a binary counter for generating the plurality of driving ability adjustment signals by performing a counting-up operation based on the receiving of the count-up signal and a flip-flop for receiving the test signal, whose timing is delayed by a predetermined time period, from the output pad connected to an external circuit and for transferring the control signal to the binary counter. Thereby, there is the effect that the driving ability adjustment signals used for the output buffer can be adjusted to the most suitable value accurately according to the load capacity of the external circuit. In addition to this effect, it is possible to form the driving ability automatic adjustment circuit having a simple configuration.

Furthermore, according to the semiconductor integrated circuit comprising the output buffer of the present invention, the output buffer comprises a plurality of pass transistors (switching means) to switch control signal to be provided to the transistors forming the inverters of the output buffer and the semiconductor integrated circuit placed in a package comprises a data store means for storing data to be used for setting switching states of the switch means according to the load capacity of an external circuit connected to the output buffer under the control externally. Thereby, it is possible to perform programming of the data store means at the outside of the package in order to adjust the driving ability of the output buffer, so that the power consumption of the semiconductor integrated circuit can be reduced.

In addition, according to the driving ability adjustment method of the output buffer of the present invention, in a semiconductor integrated circuit having the following configuration: the output buffer comprises a plurality of transistors connected in parallel between the input node to which outputs of the internal circuit in a semiconductor integrated circuit is provided and the signal output pad connected to the output buffer; the output buffer drives an external circuit connected to the output pad based on the output from the internal circuit; and the output buffer further comprises a plurality of switching means, whose switching states (the ON/ OFF states) are controlled by receiving a plurality of driving ability adjustment signals, in order to switch each of the plurality of switching means, during the driving ability adjustment mode, this method comprises the steps of: providing a test signal to the output buffer instead of the output from the internal circuit, receiving the signal from the signal output pad connected to the external circuit; setting the rising timings of the plurality of driving ability adjustment signal so that the rising timings having predetermined rising time periods; and providing the output from the internal circuit to the external circuit through the output buffer after the above steps. Thereby, there is the effect that the output buffer can have the most suitable driving ability according to the load capacity of the external circuit in order to drive the external circuit during a normal operation after the driving ability adjustment mode, so that the power consumption of the semiconductor integrated circuit can be reduced.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A semiconductor integrated circuit comprising:

an internal circuit for performing a predetermined circuit operation;

an input node for receiving an output from the internal circuit;

a signal output pad for providing a signal to an external circuit;

an output buffer, placed between the internal circuit and the signal output pad, comprising:

a plurality of transistors connected in parallel between the input node and the signal output pad, for driving the external circuit connected to the signal output pad according to the output from the internal circuit; and a plurality of switching means, each switching means switching a signal to be transferred to each of the plurality of transistors, a ON/OFF state of each switching means being controlled by receiving each of a plurality of driving ability adjustment signals;

a test signal input circuit for providing a test signal to the plurality of switching means in the output buffer instead of the output transferred from the internal circuit during a driving ability adjustment mode; and driving ability automatic adjustment means for receiving the signal transferred from the signal output pad connected to the external circuit and for setting the plurality of driving ability adjustment signals so that the signal transferred from the signal output pad to the external circuit has a predetermined rising time period during the driving ability adjustment mode.

2. A semiconductor integrated circuit as claimed in claim 1, wherein each of the plurality of switching means comprises a MOS transistor.

3. A semiconductor integrated circuit as claimed in claim 1, the driving ability automatic adjustment means comprises:

a binary counter for receiving a count-up signal, for executing a count-up operation, for outputting the plurality of driving ability adjustment signals and for halting execution of the count-up operation when receiving a control signal; and a flip-flop for receiving the signal from the signal output pad connected to the external circuit, whose receiving time being delayed from the receiving time of the test signal by a predetermined time period and for outputting the control signal to the binary counter during the driving ability adjustment mode.

4. A semiconductor integrated circuit as claimed in claim 3, wherein each of the plurality of switching means comprises a MOS transistor.

5. A semiconductor integrated circuit as claimed in claim 1, wherein a ratio of channel lengths of the plurality of transistors is 1:2: . . . :2n, where n=0, 1, 2, . . . , m and m is the number of the plurality of transistors.

6. A semiconductor integrated circuit as claimed in claim 3, wherein a ratio of channel lengths of the plurality of transistors is 1:2: . . . :2n, where n=0, 1, 2, . . . , m and m is the number of the plurality of transistors.

7. A driving ability adjustment method for an output buffer incorporated in a semiconductor integrated circuit comprising: an input node for receiving an output from an internal circuit; a signal output pad; and an output buffer comprising a plurality of transistors connected in parallel between the input node and the signal output pad, placed between the internal circuit and the signal output pad, for driving an external circuit connected to the signal output pad according to the output from the internal circuit, and a plurality of switching means, each of which switches a signal to be transferred to each of the plurality of transistors, and a driving ability of the output buffer is adjusted by setting switching states of the plurality of switching states according to a magnitude of a load capacity of the external circuit, the driving ability adjustment method comprising the steps of:

during a driving ability adjustment mode, providing a test signal to the output buffer instead of the output transferred from the internal circuit;

receiving a signal transferred from the signal output pad;

setting the plurality of driving ability adjustment signals so that the signal from the output buffer has a predetermined rising time period; and changing a state of the semiconductor integrated circuit from the driving ability adjustment mode to a normal operation mode in which the output from the internal circuit is transferred to the external circuit through the output buffer.

* * * * *